(12) United States Patent
Bin et al.

(10) Patent No.: US 10,811,429 B2
(45) Date of Patent: Oct. 20, 2020

(54) SEMICONDUCTOR DEVICE AND MANUFACTURING METHOD THEREOF

(71) Applicant: SK hynix Inc., Gyeonggi-do (KR)

(72) Inventors: Jin Ho Bin, Gyeonggi-do (KR); Il Young Kwon, Seoul (KR); Il Do Kim, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 0 days.

(21) Appl. No.: 16/177,166

(22) Filed: Oct. 31, 2018

(65) Prior Publication Data

US 2019/0280005 A1 Sep. 12, 2019

(30) Foreign Application Priority Data

Mar. 12, 2018 (KR) ........................ 10-2018-0028817

(51) Int. Cl.
| | | |
|---|---|---|
| *H01L 27/11582* | (2017.01) | |
| *H01L 29/10* | (2006.01) | |
| *H01L 21/768* | (2006.01) | |
| *H01L 27/11556* | (2017.01) | |

(52) U.S. Cl.
CPC .. *H01L 27/11582* (2013.01); *H01L 21/76837* (2013.01); *H01L 29/1037* (2013.01); *H01L 27/11556* (2013.01)

(58) Field of Classification Search
None
See application file for complete search history.

(56) References Cited

U.S. PATENT DOCUMENTS

2005/0051806 A1 3/2005 Masuoka et al.
2018/0040623 A1* 2/2018 Kanakamedala ... H01L 29/7889

FOREIGN PATENT DOCUMENTS

KR 1020130045041 5/2013

* cited by examiner

*Primary Examiner* — Long Pham
(74) *Attorney, Agent, or Firm* — IP & T Group LLP

(57) ABSTRACT

A semiconductor device includes a stack structure including conductive layers and insulating layers, which are alternately stacked; an opening including a first opening penetrating the stack structure and second openings protruding from the first opening; and a channel layer including channel regions located in the second openings and impurity regions located in the first opening, the impurity regions having an impurity concentration higher than that of the channel regions.

20 Claims, 13 Drawing Sheets

SEMICONDUCTOR DEVICE AND MANUFACTURING METHOD THEREOF

CROSS-REFERENCE TO RELATED APPLICATION

The present application claims priority under 35 U.S.C. § 119(a) to Korean patent application number 10-2018-0028817, filed on Mar. 12, 2018, which is incorporated herein by reference in its entirety.

BACKGROUND

1. Field of Invention

The present disclosure generally relates to an electronic device, and more particularly, to a semiconductor device and a manufacturing method thereof.

2. Description of Related Art

A nonvolatile memory device retains stored data even when the supply of power to the device is cut off. Recently, as improvements in the degree of integration of two-dimensional nonvolatile memory devices may be formed have reached an upper limit, three-dimensional nonvolatile memory devices have been proposed. Unlike two-dimensional nonvolatile memory devices, in which memory cells may be formed in a single layer on a substrate, three-dimensional nonvolatile memory devices have memory cells which are vertically stacked in multiple layers on a substrate.

Typically, a three-dimensional nonvolatile memory device includes a plurality of interlayer insulating layers and gate electrodes, which are alternately stacked, and a plurality of vertically extending channel layers penetrating the alternating interlayer insulating layers and the gate electrodes. Memory cells may be formed along the channel layers. Various structures and manufacturing methods have been developed for improving the operational reliability of three-dimensional non-volatile memory devices, however, further improvements are needed to satisfy consumer demand for improved electronic devices.

SUMMARY

Various embodiments of the present invention are directed to a semiconductor device having a three-dimensional stable structure and improved performance characteristics. The semiconductor device employs a structure that is easier to manufacture.

Various embodiments of the present invention are directed to a manufacturing method for making the semiconductor device. The method is advantageous over existing methods because it is simpler, easier to implement, and more economical.

In accordance with an aspect of the present disclosure, there is provided a semiconductor device including: a stack structure including conductive layers and insulating layers, which are alternately stacked; an opening including a first opening penetrating the stack structure and second openings protruding from the first opening; and a channel layer including channel regions located in the second openings and impurity regions located in the first opening, the impurity regions having an impurity concentration higher than that of the channel regions.

In accordance with another aspect of the present disclosure, there is provided a semiconductor device including: a stack structure including conductive layers and insulating layers, which are alternately stacked; an opening including a first opening penetrating the stack structure and second openings protruding from the first opening; and a channel layer including semiconductor regions located in the second openings and conductive regions located in the first opening.

In accordance with still another aspect of the present disclosure, there is provided a semiconductor device including: a stack structure; a gap fill layer including a penetration part penetrating the stack structure and protrusion parts protruding from a sidewall of the penetration part; and a channel layer including channel regions respectively surrounding the protrusion parts and impurity regions surrounding the penetration part, the impurity regions having an impurity concentration higher than that of the channel regions.

In accordance with still another aspect of the present disclosure, there is provided a method of manufacturing a semiconductor device, the method including: forming a stack structure; forming a first opening penetrating the stack structure; forming second openings protruding from the first opening; and forming a channel layer including channel regions located in the second openings and impurity regions located in the first opening, the impurity regions having an impurity concentration higher than that of the channel regions.

In accordance with still another aspect of the present disclosure, there is provided a method of manufacturing a semiconductor device, the method including: forming a stack structure; forming a first opening penetrating the stack structure; forming second openings protruding from the first opening; and forming a channel layer including semiconductor regions located in the second openings and conductive regions located in the first opening.

BRIEF DESCRIPTION OF THE DRAWINGS

Exemplary embodiments of the present invention will now be described more fully hereinafter with reference to the accompanying drawings; however, it is noted that the present invention may be embodied in different other embodiments and variations thereof and should not be construed as limited only to the embodiments set forth herein. Rather, these embodiments are provided solely for the purpose of rendering an enabling disclosure which fully conveys the scope of the invention to those skilled in the art.

In the drawing figures, dimensions may be exaggerated for clarity of illustration. It will be understood that when an element is referred to as being "between" two elements, it can be the only element between the two elements, or one or more intervening elements may also be present. Like reference numerals refer to like elements throughout.

DETAILED DESCRIPTION

Figure 1A:
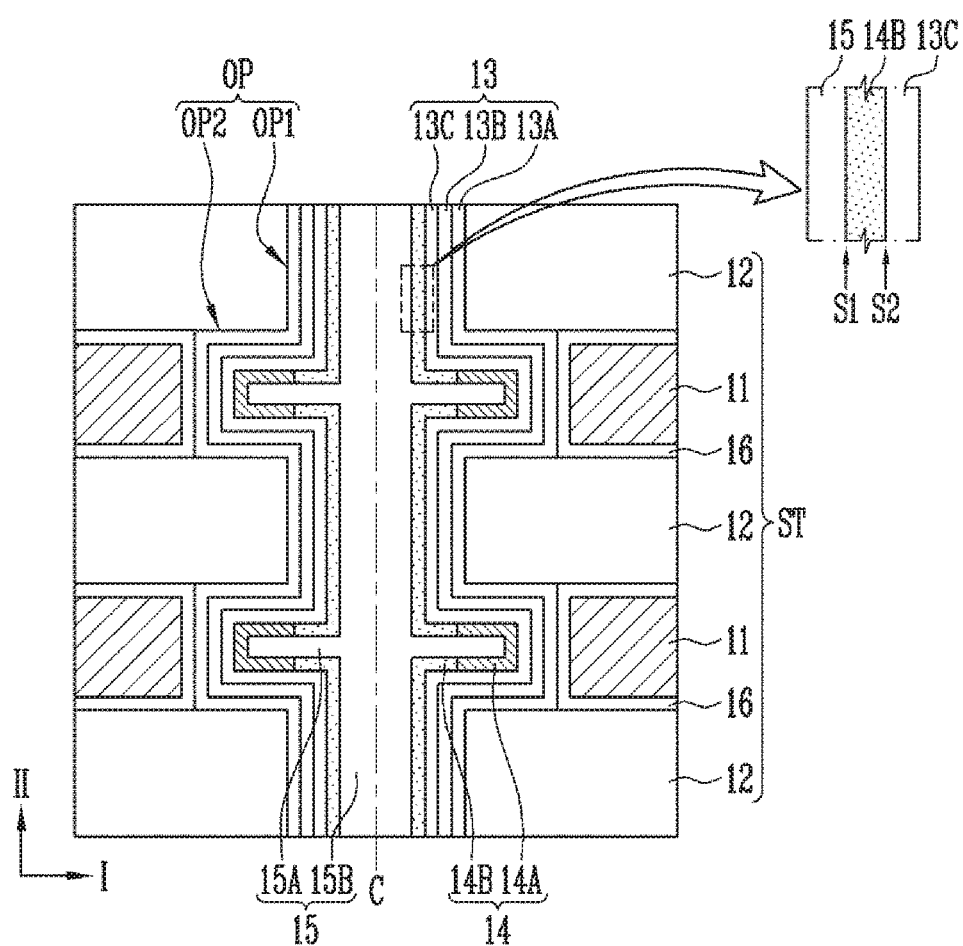
FIGS. 1A to 1D are sectional views illustrating structures of semiconductor devices in accordance with embodiments of the present disclosure.

Example embodiments of the present disclosure of the invention will be described with reference to the accompanying drawings. The invention may, however, be embodied in many different forms and should not be construed as limited to the example embodiments set forth herein. Rather, the example embodiments are provided so that the disclosure of will be thorough and complete, and will fully convey the scope of the invention to those skilled in the art. The features of the example embodiments of the present disclosure may be employed in various other embodiments without departing from the scope of the invention. In the drawings, the size and relative sizes of layers and areas may be exaggerated for clarity. The drawings are not to scale. Like reference numerals refer to like elements throughout.

In the entire specification, when an element is referred to as being "connected" or "coupled" to another element, it can be directly connected or coupled to the another element or be indirectly connected or coupled to the another element with one or more intervening elements interposed therebetween. In addition, when an element is referred to as "including" a component, this indicates that the element may further include another component instead of excluding another component unless clearly stated otherwise.

FIGS. 1A to 1D are sectional views illustrating structures of semiconductor devices in accordance with embodiments of the present disclosure.

Referring to FIG. 1A, a semiconductor device includes a stack structure ST and a channel layer 14 penetrating the stack structure ST. Also, the semiconductor memory device may further include a memory layer 13, a gap fill layer 15, and third material layers 16.

The stack structure ST includes a first material layer 11 and a second material layer 12. For example, the stack structure ST includes first material layers 11 and second material layers 12, which are alternately stacked. The first material layers 11 may be conductive layers used as gate electrodes of memory cells, select transistors, and the like. For example, the first material layers 11 may be made of or include a metal layer, a polysilicon layer, a silicide layer, and the like. The metal layer may be, for example, tungsten. The second material layers 12 may be insulating layers for insulating the stacked gate electrodes from each other. For example, the second material layers 12 may be made of or include an oxide, a nitride, and the like.

The stack structure ST includes at least one opening OP penetrating the stack structure ST in a second direction II. The second direction II may be a direction in which the first and second material layers 11 and 12 are stacked. Although one opening OP is illustrated in the drawing, the stack structure ST may include a plurality of openings OP. The openings OP may be arranged in a matrix form. The openings OP may be arranged in a staggered form in which their central axes are deviated from each other.

The opening OP includes at least one first opening OP1 and at least one second opening OP2. The first opening OP1 may penetrate the stack structure ST in the stacked direction, i.e., a II direction as illustrated in FIG. 1A. The stacked direction or II direction may be vertical to the plane of the substrate. The second opening OP2 may protrude from the first opening OP1 in a first direction I. For example, the second opening OP2 may protrude from a sidewall of the first opening OP1. As shown in FIG. 1A, the second openings OP2 may protrude symmetrically from the respective sidewalls of the first opening at levels corresponding to the first material layers 11. A plurality of second openings OP2 may be connected to one first opening OP1, to form one opening OP. The second openings OP2 may be located at levels corresponding to the first material layers 11. Therefore, the second openings OP2 may be located between the stacked second material layers 12.

The channel layer 14 is located in the opening OP. The channel layer 14 may have a thickness which does not completely fill in the second openings OP2. The channel layer 14 may be formed along inner surfaces of the first and second openings OP1 and OP2. The channel layer 14 may be formed conformally along inner surfaces of the first and second openings OP1 and OP2. The channel layer 14 may include an impurity with different concentrations in different regions. The channel layer 14 may have a different semiconductor property or conductivity in different regions. For example, the channel layer 14 may be made of or include silicon (Si), germanium (Ge), etc. and may include an N-type or a P-type impurity.

The channel layer 14 may include channel regions 14A and impurity regions 14B. The channel regions 14A may be respectively located in the second openings OP2, and have a C-shaped section. For example, the channel regions 14A may have a letter C shape with orthogonal angles. The impurity regions 14B may be located in the first opening OP1, and extend in the second direction II along the inner surface of the first opening OP1. Also, the impurity regions 14B may extend in a first direction I inside each second where they meet the C shape channel regions 14A. The first direction I intersects the second direction II, and may be parallel to the plane of the substrate.

The channel regions 14A may be located at levels corresponding to the first material layers 11. The impurity regions 14B may be located at levels corresponding to the second material layers 12. For example, the impurity regions 14B may be located primarily at levels corresponding to the second material layers 12 with only a small portion thereof located at a level corresponding to the first material layers 11. The channel regions 14A and the impurity regions 14B may be alternately arranged in the channel layer 14.

The impurity regions 14B may have an impurity concentration higher than that of the channel regions 14A. Also, the impurity regions 14B may have a semiconductor property or conductivity depending on the impurity concentration. In an example, the impurity region 14B may be a semiconductor region having an impurity region higher than that of the channel region 14A. Therefore, the channel layer 14 may be a semiconductor layer in which semiconductor regions having different impurity concentrations are alternately arranged. In another example, the impurity region 14B may be a conductive region having an impurity concentration higher than that of the channel region 14A. Therefore, the channel layer 14 may include semiconductor regions and conductive regions, which are alternately arranged.

In an embodiment, only the impurity regions 14B of the channel layer 14 may include an impurity. In an embodiment, both the channel regions 14A and the impurity regions 14B may include impurities of the same type or of different types. For example, the channel layer 14 may be a polysilicon layer, the channel regions 14A may be undoped polysilicon layers that do not include any impurity, and the impurity regions 14B may be doped polysilicon layers. The impurity regions 14B may include an N-type impurity or include a P-type impurity. In another example, the channel layer 14 may be an N-type polysilicon layer, the channel regions 14A may include an N-type impurity with a first concentration, and the impurity regions 14B may include an N-type or P-type impurity with a second concentration higher than the first concentration. In still another example, the channel layer 14 may be a P-type polysilicon layer, the channel regions 14A may include a P-type impurity with a first concentration, and the impurity regions 14B may include an N-type or P-type impurity with a second concentration higher than the first concentration.

When the channel regions 14A and the impurity regions 14B include an impurity of the same type, the impurity regions 14B may have a conductivity higher than that of the channel regions 14A. Thus, the entire resistance of the channel layer 14 can be decreased. Also, when the channel regions 14A and the impurity regions 14B include impurities of different types, the impurity regions 14B may be used as junctions of the stacked memory cells.

The impurity regions 14B may include an impurity with a uniform concentration, or have a concentration gradient in the thickness direction thereof. For example, an impurity concentration at a first surface S1 of each impurity region 14B, which is in contact with the gap fill layer 15, may be higher than that at a second surface 52 of the impurity region 14B, which is in contact with the memory layer 13. In other words, in each impurity region 14B, an impurity may be distributed such that the concentration of the impurity region 14B decreases as the distance from the center C of the first opening OP1 increases.

The memory layer 13 may be formed to surround the channel layer 14. For example, the memory layer 13 may be formed directly on the channel layer 14. The memory layer 13 may include at least one of a tunnel insulating layer 13C, a data storage layer 13B, and a charge blocking layer 13A. In addition, the data storage layer 13B may be or include a floating gate, a charge trap material, silicon, a nitride, a variable resistance material, a phase change material, nano dots, and the like.

The gap fill layer 15 is formed in the channel layer 14. The gap fill layer 15 may include a penetration part 15B penetrating the stack structure ST and at least one protrusion part 15A protruding from the penetration part 15B. Therefore, the channel layer 14 may have a structure surrounding the gap fill layer 15, the channel regions 14A may surround the respective protrusion parts 15A, and the impurity regions 14B may be formed to surround the penetration part 15B. The gap fill layer 15 may be made of or include an insulating layer such as an oxide or a nitride. A void (not shown) may exist in the gap fill layer 15.

The third material layers 16 may be formed to respectively surround the first material layers 11. Each third material layer 16 may be interposed between the second material layer 12 and the first material layer 11 and between the first material layer 11 and the memory layer 13. The third material layers 16 may function as barrier layers for improving adhesion, contact resistance, etc. of the first material layers 11. The third material layers 16 may for example be made of or include tantalum nitride (TaN), titanium nitride (TiN), tungsten nitride (WN), and the like.

According to the above-described structure, a plurality of memory cells can be stacked along the channel layer 14. Further, the entire resistance of the channel layer 14 can be decreased by using the impurity regions 14B as junctions of the memory cells or by using the impurity regions 14B having conductivity. Thus, the cell current can be increased.

Meanwhile, although not shown in the drawing, a lower structure including a peripheral circuit, an interconnection, and the like may be located under the stack structure ST. For example, a peripheral region including a peripheral circuit, an interconnection, and the like may be located under a cell region including the stack structure ST.

Figure 1B:
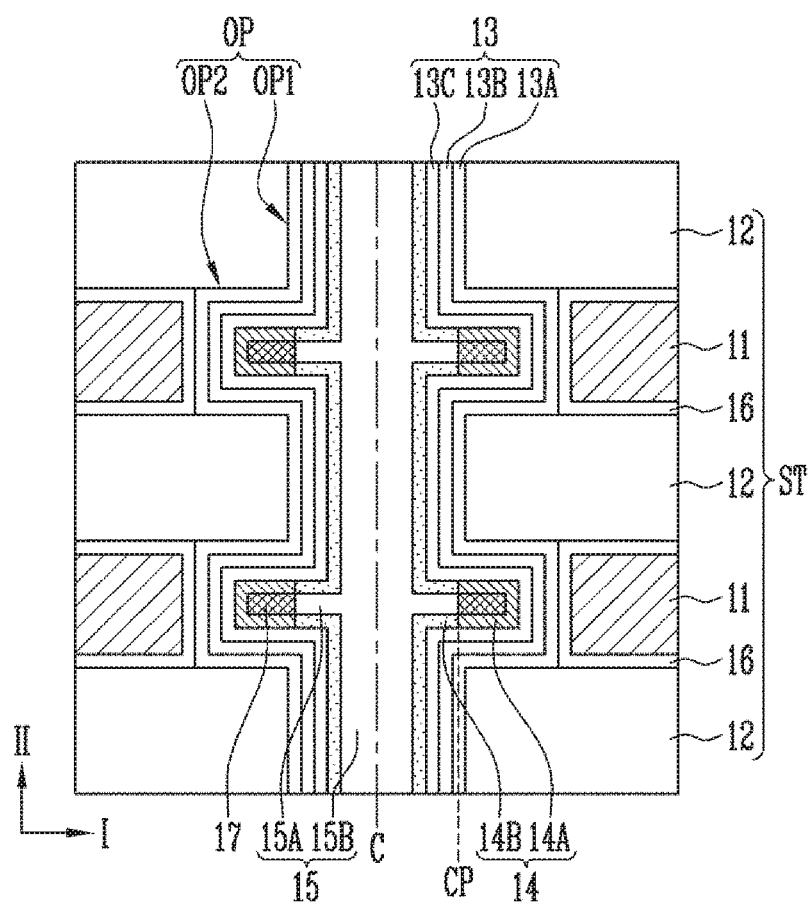
Figure 1C:
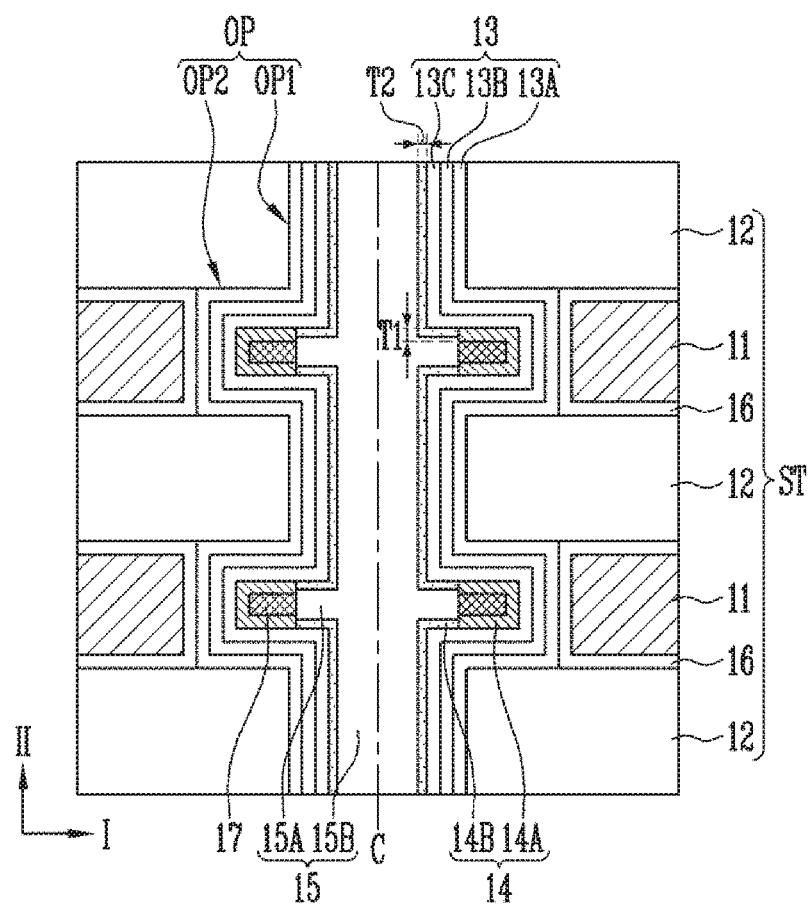
Figure 1D:
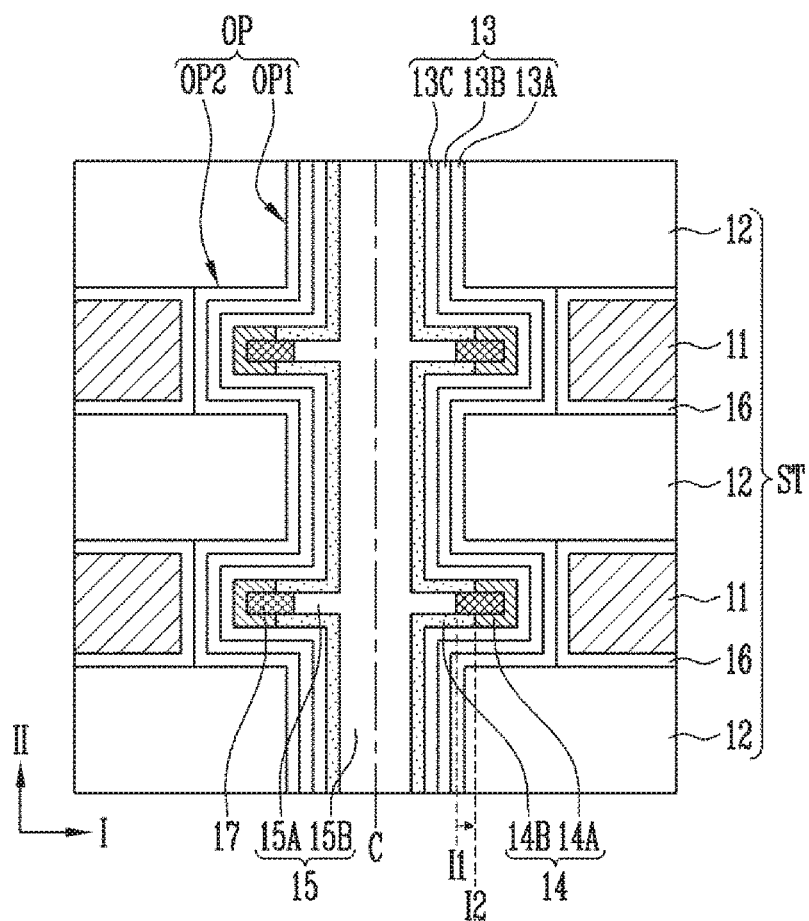

FIGS. 1B to 1D illustrate various modifications of FIG. 1A. Hereinafter, descriptions of contents overlapping with those of the above-described embodiment will be omitted.

Referring to FIG. 1B, a semiconductor device may further include barrier patterns 17. The barrier patterns 17 are located in the channel layer 14, and more specifically may be respectively located in the channel regions 14A. The barrier patterns 17 are interposed between the channel layer 14 and the gap fill layer 15. The barrier patterns 17 may include a material having a higher etch selectivity different from the channel layer 14. For example, the barrier patterns 17 may be made of or include an insulating layer such as oxide or nitride, and include a metal.

The barrier patterns 17 may be barriers used to mask undoped regions when the impurity regions 14B may be formed. Therefore, an interface between the barrier patterns 17 and the gap fill layer 15 may be located on the same plane CP as that between the channel regions 14A and the impurity regions 14B.

Referring to FIG. 1C, the channel layer 14 may have different morphologies depending on its regions. For example, the channel layer 14 may have different thicknesses depending on its regions, or have different surface roughnesses depending on its regions.

For example, as illustrated in FIG. 1C, a region of the channel region 14, which is exposed by the barrier patterns 17, may have a thickness thinner than that of a region covered by the barrier patterns 17 (T2<T1). Also, the exposed region may have a surface that is rougher than that of the covered region. The difference in morphology may be caused when the exposed channel layer 14 is damaged in a process of doping an impurity.

A region of the channel layer 14, which has a thin thickness or a rough surface, may be an impurity region, and a region of the channel layer 14, which has a thick thickness or a smooth surface, may be a channel region. That is, the impurity regions 14B may have a thickness thinner than that of the channel regions 14A (T2<T1), or have a surface rougher than that of the channel regions 14A. Meanwhile, the region of the channel layer 14, which has a thin thickness or a rough surface, may not completely correspond to the impurity regions 14B. For example, when the impurity regions 14B extend due to diffusion of an impurity, regions adjacent to the channel regions 14A among the impurity regions 14B may have a thick thickness T2.

Referring to FIG. 1D, a first interface 11 between the barrier patterns 17 and the gap fill layer 15 may be located on a plane different from a second interface 12 between the channel regions 14A and the impurity regions 14B. For example, the first interface 11 may be located closer to the first opening OP1. In other words, a distance from the center C of the first opening OP1 to the first interface 11 may be shorter than that from the center C of the first opening OP1 to the second interface 12. This difference in distance may be caused due to diffusion of an impurity.

Meanwhile, it is noted that although FIGS. 1C and 1D illustrate a case where semiconductor devices include the barrier patterns 17, the semiconductor devices may not include the barrier patterns 17. In addition, the various features described with reference to one of the FIGS. 1A to 1D may be combined with features of another one of the FIGS. 1A to 1D.

FIGS. 2A to 2G are sectional views illustrating a manufacturing method for making a semiconductor device in accordance with an embodiment of the present disclosure.

Figure 2A:
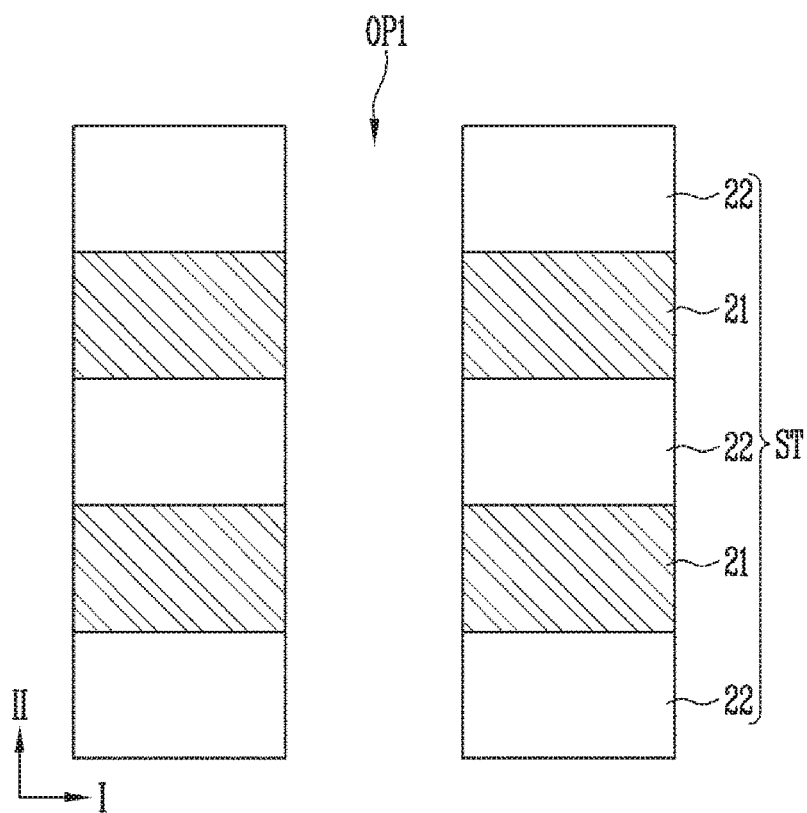
FIGS. 2A to 2G are sectional views illustrating a manufacturing method of a semiconductor device in accordance with an embodiment of the present disclosure.

Referring to FIG. 2A, there is formed a stack structure ST including at least one first material layer 21 and at least one second material layer 22. The first material layers 21 may be used to form gate electrodes of memory cells, select transistors, and the like, or may be sacrificial layers. The second material layers 22 may be used to insulate the stacked gate electrodes from each other.

The first material layers 21 may be formed of a material having a higher etch selectivity different from the second material layers 22. In an example, the first material layers 21 may be sacrificial layers and may be made of or including nitride, etc., whereas the second material layers 22 may be insulating layers made of or including oxide, etc. In another example, the first material layers 21 may be conductive layers made of or including polysilicon, tungsten, etc., and the second material layers 22 may be insulating layers made of or including oxide, etc. In still another example, the first material layers 21 may be conductive layers made of or including doped polysilicon, etc., and the second material layers 22 may be sacrificial layers made of or including undoped polysilicon, etc.

Although not shown in the drawing, a lower structure may be formed before the stack structure ST is formed. For example, the lower structure may include a peripheral circuit, an interconnection structure and the like. The interconnection structure may include contact plugs, lines, and the like.

Subsequently, a first opening OP1 may be formed which is penetrating the stack structure ST. Although one first opening OP1 is illustrated in the drawing, a plurality of first openings OP1 may be formed. The plurality of first openings OP1 may be arranged in any suitable pattern. For example, the plurality of first openings OP1 may be arranged in a matrix having rows and columns of first openings spaced apart from one another at a regular interval. For example, the plurality of first openings OP1 may be formed in a staggered pattern in which the central axes of the first openings in at least one direction form a zig-zag line. Many other patterns may be employed including patterns wherein the central axes of the first openings deviate from each other.

Figure 2B:
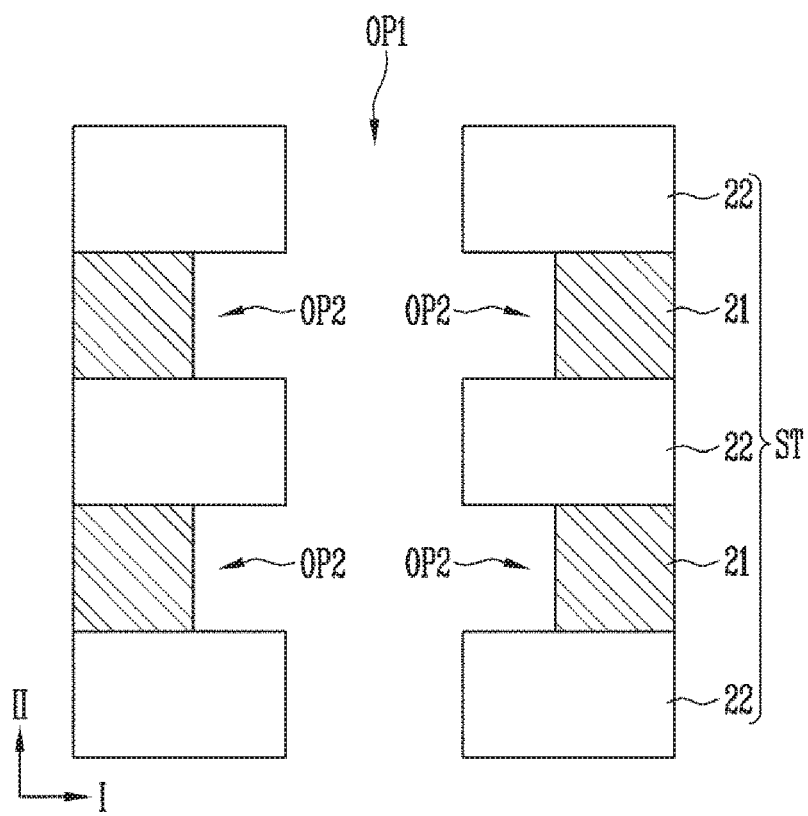

Referring to FIG. 2B, there may be formed second openings OP2 protruding from the first opening OP1 in the first direction I. The second openings OP2 may protrude from a sidewall of the first opening OP1. For example, the second openings OP2 may be formed by selectively etching the first material layers 21 after being exposed by the first opening OP1. Accordingly, the second openings OP2 may be formed, which are located at levels corresponding to the first material layers 21.

Figure 2C:
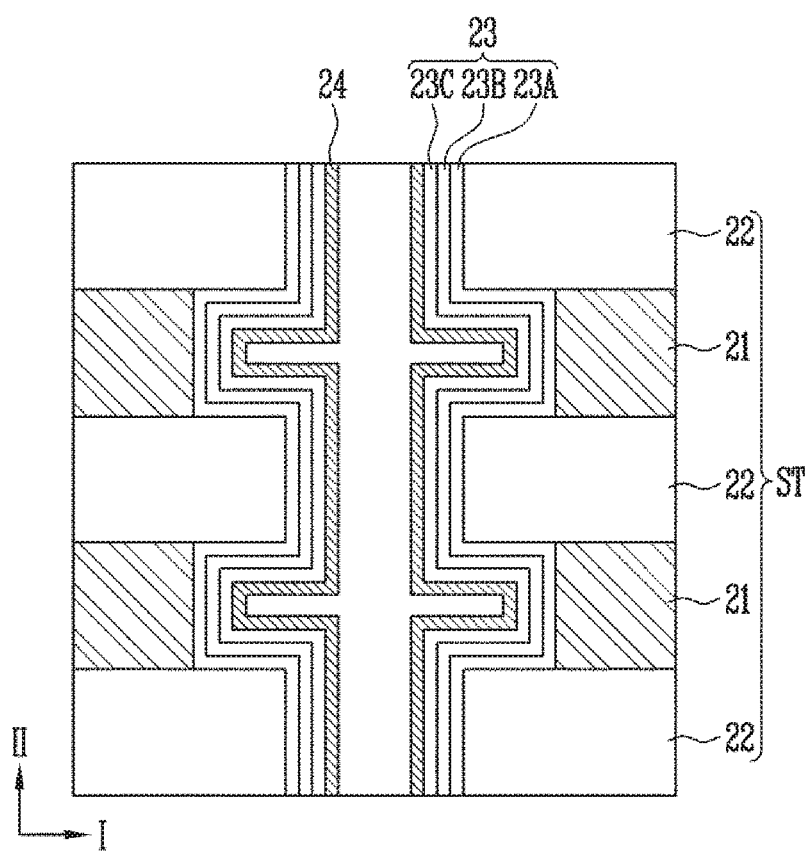

Referring to FIG. 2C, a memory layer 23 may be formed in the first and second openings OP1 and OP2. For example, the memory layer 23 may be formed on the side walls of the first and second openings OP1 and OP2. The memory layer 23 includes at least one of a charge blocking layer 23A, a data storage layer 23B, and a tunnel insulating layer 23C. For example, the charge blocking layer 23A, the data storage layer 23B, and the tunnel insulating layer 23C are sequentially formed conformally along the inner surfaces of the first and second openings OP1 and OP2. The charge blocking layer 23A may be formed directly on the inside surface of the side walls of the first and second openings OP1 and OP2.

Subsequently, a channel layer 24 is formed. The channel layer 24 may be made of any suitable semiconductor material including silicon (Si), germanium (Ge), etc. The channel layer 24 may be doped or undoped. For example, the channel layer 24 may be an undoped polysilicon layer. In another example, the channel layer may be a polysilicon layer including a P-type impurity.

The channel layer 24 may be formed along the inner surfaces of the first and second openings OP1 and OP2. For example, the channel layer 24 may be formed on the memory layer 23 or may be formed directly on the memory layer 23. The channel layer 24 may be formed to a thickness with which it does not completely fills in the first and second openings OP1 and OP2. The channel layer 24 may be formed using a deposition process.

Figure 2D:
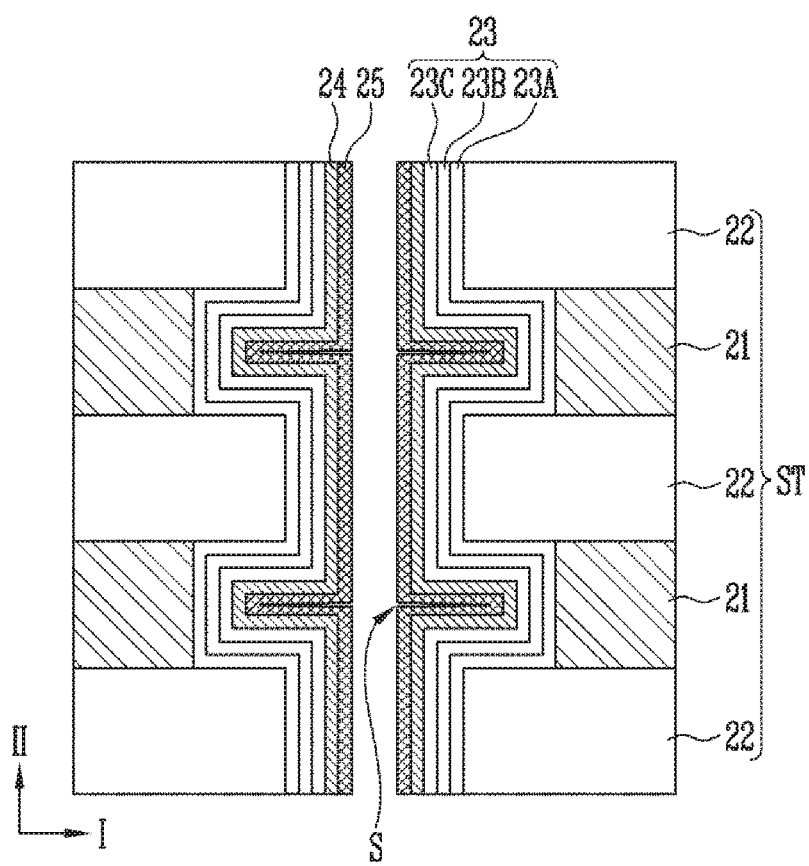

Referring to FIG. 2D, a barrier layer 25 may be formed. The barrier layer 25 may be made of or include a material having a higher etch selectivity different from the channel layer 24. For example, the barrier layer 24 may be made of or include an insulating layer such as oxide or nitride, and may be made of or include a metal.

The barrier layer 25 may be formed to a thickness with which it does not completely fills in the first opening OP1. Also, the barrier layer 25 may be formed using a deposition process. The barrier layer 25 may form a seam S at positions corresponding to the second openings OP2. The seam S may not be filled with the barrier layer 25 as illustrated in FIG. 2D.

Figure 2E:
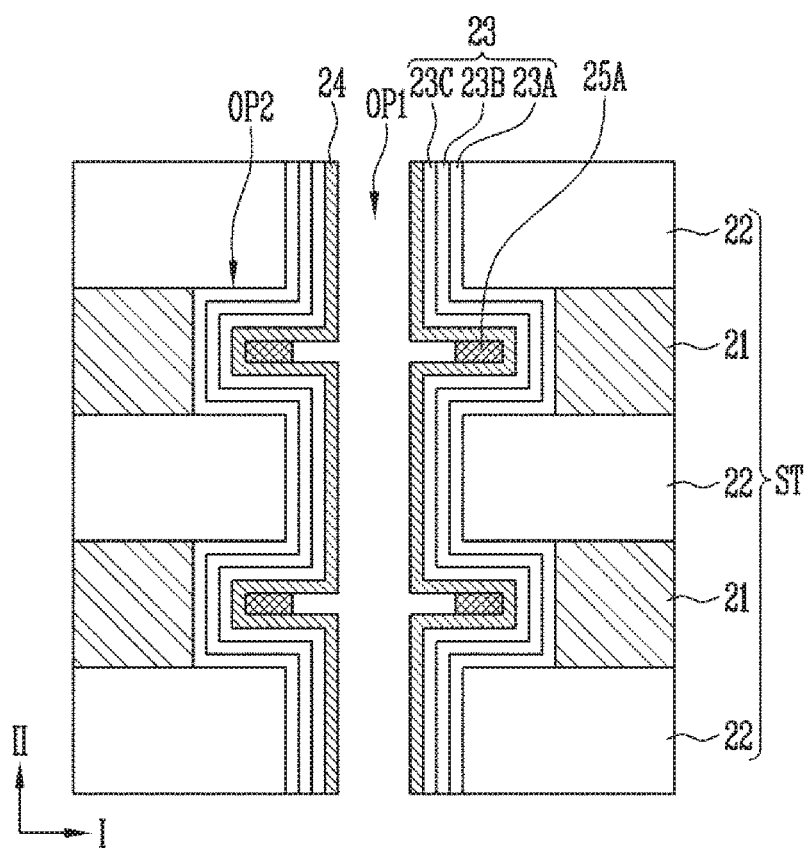

Referring to FIG. 2E, barrier patterns 25A may be formed. For example, the barrier patterns 25A respectively located inside corresponding second openings OP2 may be formed by partially etching the barrier layer 25. The barrier layer 25 may be etched using a cleaning process. For example, the barrier layer 25 may be etched using a dry cleaning process.

The barrier patterns 25A are used to mask those regions of the channel layer 24 which are not to be doped with an impurity in a subsequent impurity doping process. Therefore, the material, shape, etc. of the barrier patterns 25A may be adjusted according to an impurity doping method, an impurity doping condition, etc. In the illustrated embodiment of FIG. 2E there is no barrier layer 25 left on the first opening OP1. However, the invention is not limited in this way. For example, in an embodiment, a thin barrier material may remain in the first opening OP1 after the etching process. The barrier material remaining in the first opening OP1 may be sufficiently thin to allow an impurity to reach the channel layer 24 by passing through the thin barrier material.

Figure 2F:
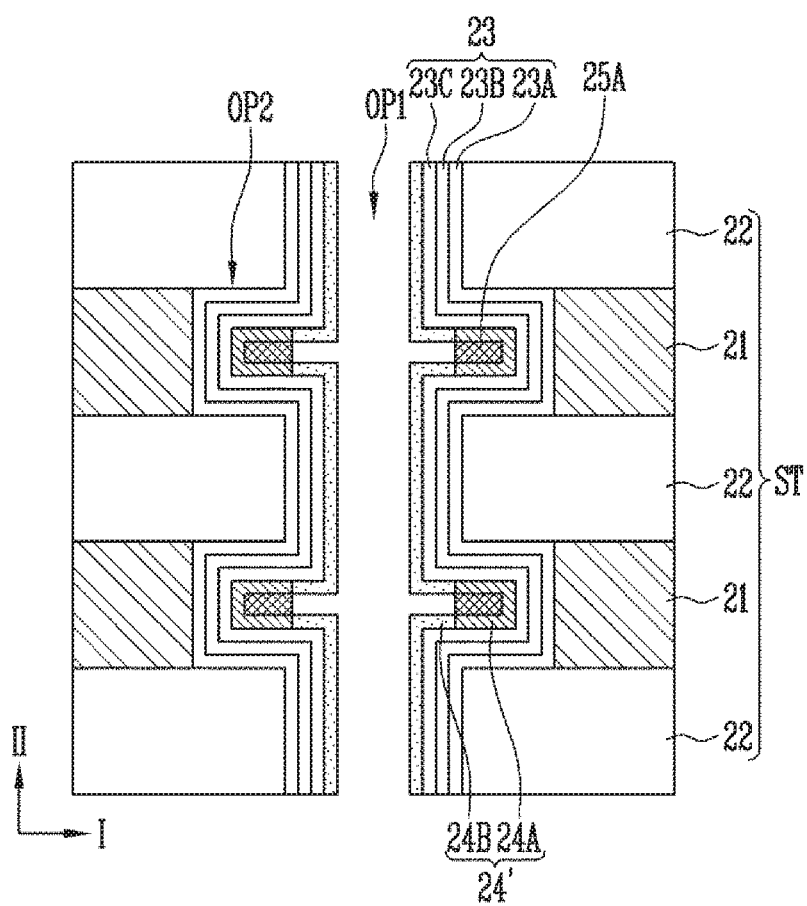

Referring to FIG. 2F, impurity regions 24B may be formed in the channel layer 24 which were not protected by the barrier patterns 25A. For example, the impurity regions 24B may be formed by doping an impurity, using a plasma doping process, a gas treatment process, and the like. The regions of the channel layer 24 which are covered by the barrier patterns 25A are not doped with any impurity and become undoped channel regions 24A. The regions of the channel layer 24 which are exposed by the barrier patterns 25A are doped with an impurity to become the impurity regions 24B. Accordingly, the undoped channel regions 24A and the doped channel regions 24B (also referred to as the impurity regions 24B), which are alternately arranged, are defined in the channel layer 24'. The channel layer 24' may refer to the channel layer 24 after the impurities are doped. The channel layer 24' may include the doped and undoped regions alternating along the second direction II.

The impurity may be an N-type or P-type impurity. In an example, when the channel layer 24' is an undoped layer including no impurity, the impurity region 24B is formed by doping an N-type or P-type impurity. In another example, when the channel layer 24' is a doped layer including an N-type impurity, the impurity region 24B is formed by doping an N-type or P-type impurity. In still another example, when the channel layer 24' is a doped layer including a P-type impurity, the impurity region 24B is formed by doping an N-type or P-type impurity. Accordingly, the impurity region 24B is formed, which has an impurity concentration higher than that of the channel region 24A.

A property of the impurity region 24B may be changed by changing the concentration of the impurity in the impurity region 24B. In an example, the impurity region 24B may be a semiconductor region having an impurity concentration higher than that of the channel region 24A. In another example, the impurity region 24B may be a conductive region having an impurity concentration higher than that of the channel region 24A.

The morphology of the impurity regions 24 and the channel regions 24A may be controlled by selecting an impurity doping method. For example, by using a plasma doping process, a surface of the channel layer 24' may be exposed to a plasma gas during the impurity doping procedure causing the impurity regions 24B which are formed to have a thickness that is thinner than that of the channel regions 24A, and also have rougher surfaces than those of the channel regions 24A.

The impurity regions 24B may have a variable impurity distribution. The variable impurity distribution may be controlled by selecting the doping method and its conditions. In an example, a plasma doping process may be used to form impurity regions 24B which have an impurity concentration changed in the thickness thereof. For example, the impurity regions 24B may have a relatively high impurity concentration at surfaces thereof, which decreases gradually towards the memory layer 23. In another example the channel layer 24' may be processed using an impurity source gas, to form the impurity regions 24B which have a uniform impurity concentration in the thickness direction thereof.

After the impurity is doped into the channel layer 24, a heat treatment process may be performed for activating the doped impurities. The heat treatment process may cause the impurities to diffuse into a region of the channel layer 24' which overlaps with the barrier layer 25A. Therefore, in this way the impurity regions 24B may be extended as described with reference to FIG. 1D.

Figure 2G:
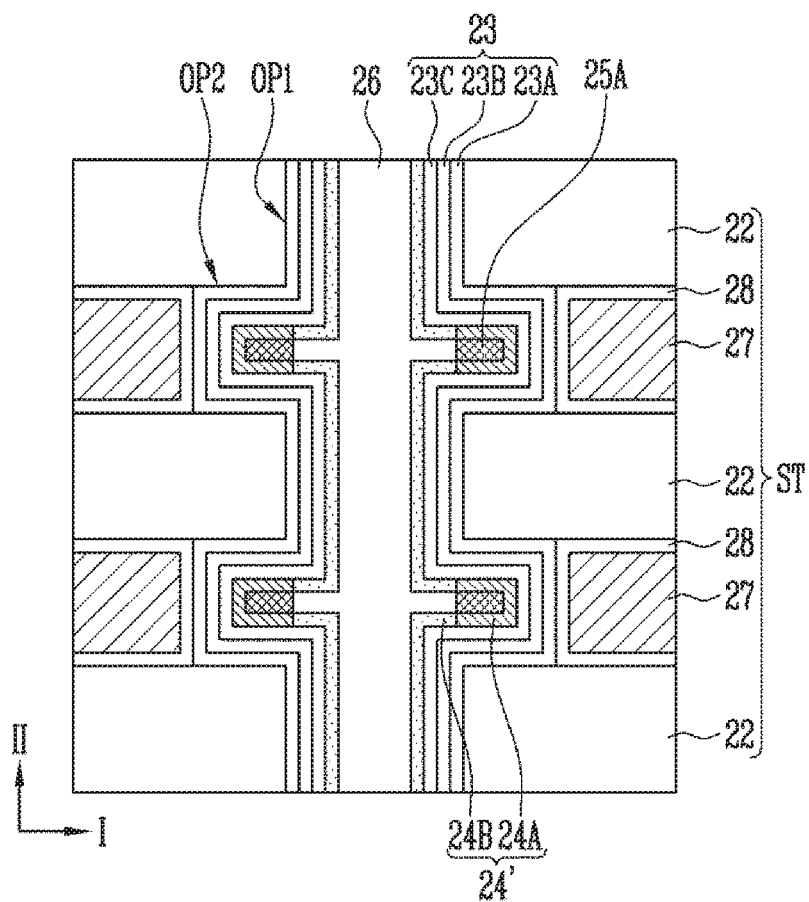

Referring to FIG. 2G, a gap fill layer 26 may be formed inside the first and second openings OP1 and OP2. The gap fill layer 26 may be made of or include an insulating material such as an oxide material or a nitride material. For example, the gap fill layer 26 may be formed using a flowable oxide material. In another example, the gap fill layer 26 may be formed using a deposition process such as ALD. The barrier patterns 25A may be removed before the gap fill layer 26 is formed. For example, the barrier patterns 25A including an insulating layer may remain, and the barrier patterns 25A including a metal layer may be removed.

Subsequently, an additional process is performed depending on the material of the first material layers 21. In an example, when the first material layers 21 are sacrificial layers and the second material layers 22 are insulating layers, the first material layers 21 are replaced with third material layers. The third material layers 27 may include a metal such as tungsten, or include a conductive material such as polysilicon. In addition, fourth material layers 28 may be formed before forming the third material layers 27. The fourth material layer 28 may be used to improve adhesion, contact resistance, etc. of the third material layers 27. For example, the fourth material layer 28 may be made of or include tungsten nitride, tantalum nitride, titanium nitride, etc.

In another example, when the first material layers 21 are conductive layers and the second material layers 22 are insulating layers, a process of silicidizing the first material layers 21 may be additionally performed. In still another example, when the first material layers 21 are conductive layers and the second material layers 22 are sacrificial layers, a process of replacing the second material layers 22 with insulating layers may be additionally performed.

According to the above-described process, the channel regions 24A and the impurity regions 24B may be formed in the channel layer 24'. The impurity regions 24B may be used as junctions of the stacked memory cells, and accordingly, the operational characteristics of the memory cells can be improved. Alternatively, the entire resistance of the channel layer 24' is decreased using the impurity regions 24B having conductivity, so that cell current can be increased.

Figure 3:
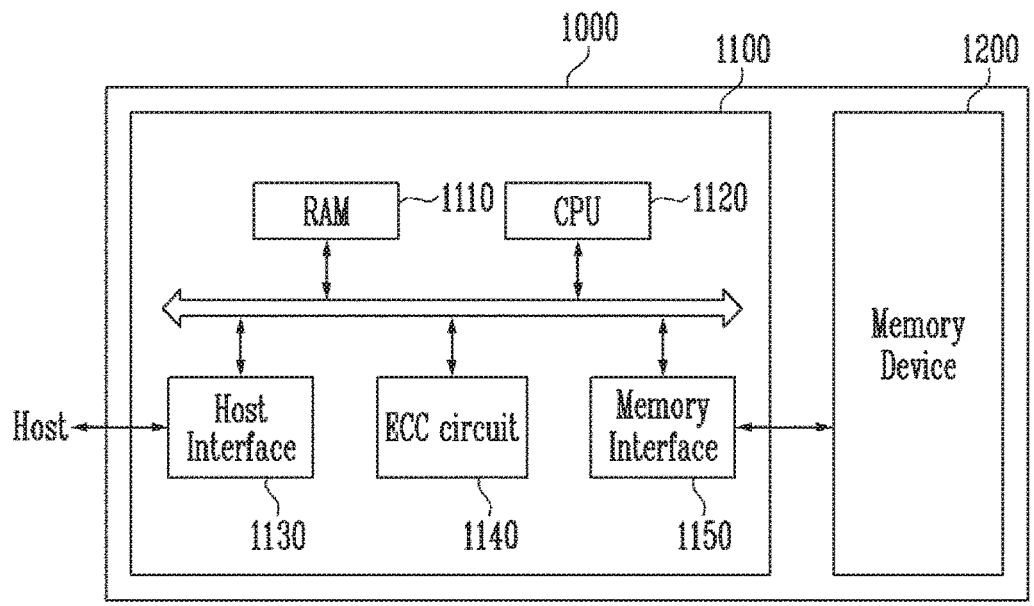
FIGS. 3 and 4 are block diagrams illustrating configurations of memory systems in accordance with embodiments of the present disclosure.

FIG. 3 is a block diagram illustrating an exemplary configuration of a memory system in accordance with an embodiment of the present disclosure.

Referring to FIG. 3, the memory system 1000 in accordance with the embodiment of the present disclosure includes a memory device 1200 and a controller 1100.

The memory device 1200 may be used to store data information having various data formats such as texts, graphics, and software codes. The memory device 1200 may be a nonvolatile memory. Also, the memory device 1200 may include a structure described with reference to FIGS. 1A to 2G. The memory device may be manufactured according to a manufacturing method described with reference to FIGS. 1A to 2G. In an embodiment, the memory device 1200 may include: a stack structure including conductive layers and insulating layers, which are alternately stacked; an opening including a first opening penetrating the stack structure and second openings protruding from the first opening; and a channel layer including channel regions located in the second openings and impurity regions located in the first opening, the impurity regions having an impurity concentration higher than that of the channel regions. The structure and manufacturing method of the memory device 1200 are the same as described above, and therefore, their detailed descriptions will not be repeated herein.

The controller 1100 may be connected to a host and the memory device 1200, and may be configured to access the memory device 1200 in response to a request from the host. For example, the controller 1100 may be configured to control reading, writing, erasing, and background operations of the memory device 1200.

The controller 1100 may include a random-access memory (RAM) 1110, a central processing unit (CPU) 1120, a host interface 1130, an error correction code (ECC) circuit 1140, a memory interface 1150, and the like.

The RAM 1110 may be used as a working memory of the CPU 1120, a cache memory between the memory device 1200 and the host, and a buffer memory between the memory device 1200 and the host. For reference, the RAM 1110 may be replaced with a static random access memory (SRAM), a read only memory (ROM), etc.

The CPU 1120 may be configured to control overall operations of the controller 1100. For example, the CPU 1120 may be configured to operate firmware such as a flash translation layer (FTL) stored in the RAM 1110.

The host interface 1130 may be configured to interface with the host. For example, the controller 1100 may communicate with the host using at least one of a variety of interface protocols, such as a universal serial bus (USB) protocol, a multimedia card (MMC) protocol, a peripheral component interconnection (PCI) protocol, a PCI-Express (PCI-E) protocol, an advanced technology attachment (ATA) protocol, a Serial-ATA protocol, a Parallel-ATA protocol, a small computer small interface (SCSI) protocol, an enhanced small disk interface (ESDI) protocol, an integrated drive electronics (IDE) protocol, and a private protocol.

The ECC circuit 1140 may be configured to detect and correct an error included in data that is read from the memory device 1200, using an error correction code (ECC).

The memory interface 1150 may be configured to interface with the memory device 1200. For example, the memory interface 1150 includes a NAND interface or NOR interface.

The controller 1100 may further include a buffer memory (not shown) for temporarily storing data. The buffer memory may be used to temporarily store data transferred to the outside through the host interface 1130 or data transferred from the memory device 1200 through the memory interface 1150. The controller 1100 may further include a ROM that stores code data for interfacing with the host.

As described above, the memory system 1000 in accordance with the embodiment of the present disclosure may include the memory device 1200 having an improved degree of integration and improved characteristics, and thus the degree of integration and characteristics of the memory system 1000 can be improved.

Figure 4:
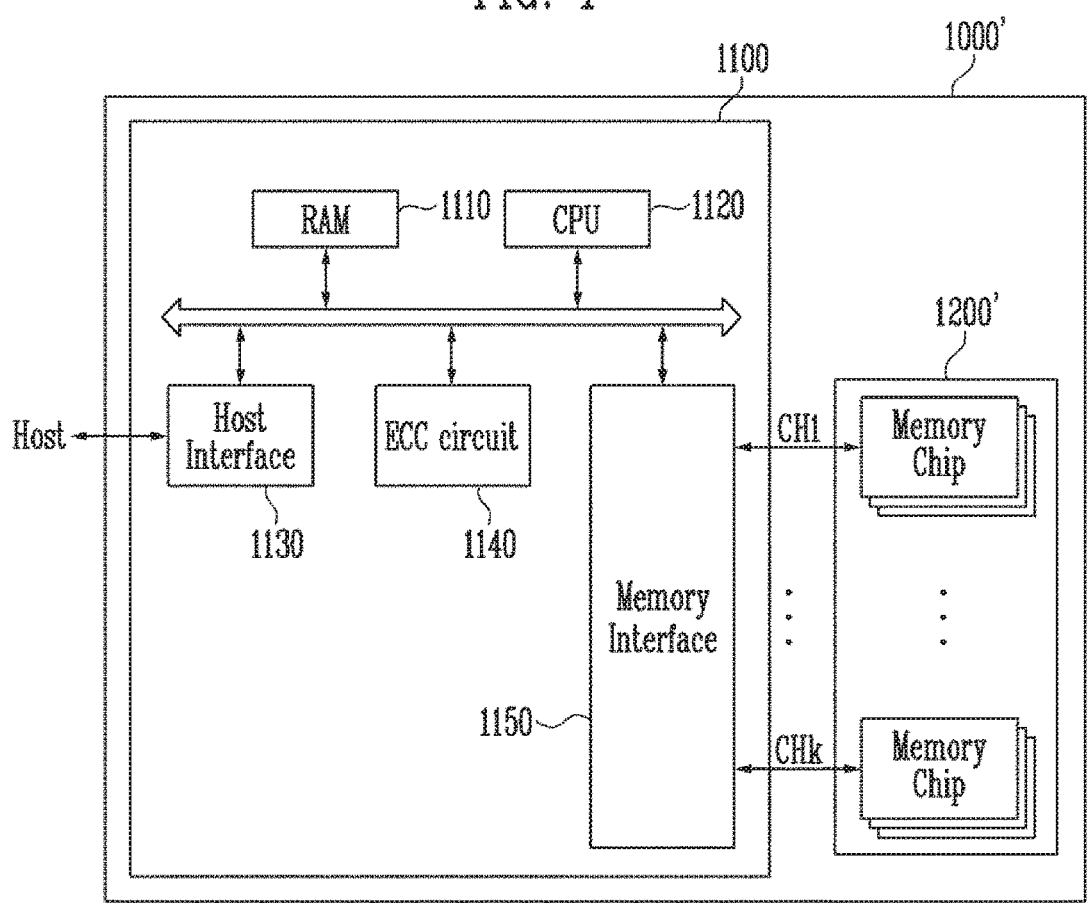

FIG. 4 is a block diagram illustrating an exemplary configuration of a memory system in accordance with an embodiment of the present disclosure. Hereinafter, descriptions of contents overlapping with those described above will be omitted.

Referring to FIG. 4, the memory system 1000' in accordance with the embodiment of the present disclosure may include a memory device 1200' and a controller 1100. The controller 1100 may include a RAM 1110, a CPU 1120, a host interface 1130, an ECC circuit 1140, a memory interface 1150, and the like.

The memory device 1200' may be a nonvolatile memory. Also, the memory device 1200' may include a structure described with reference to FIGS. 1A to 2G. The memory device may be manufactured according to a manufacturing method described with reference to FIGS. 1A to 2G. In an embodiment, the memory device 1200' may include: a stack structure including conductive layers and insulating layers, which are alternately stacked; an opening including a first opening penetrating the stack structure and second openings protruding from the first opening; and a channel layer including channel regions located in the second openings and impurity regions located in the first opening, the impurity regions having an impurity concentration higher than that of the channel regions. The structure and manufacturing method of the memory device 1200' are the same as described above, and therefore, their detailed descriptions will not be repeated herein.

The memory device 1200' may be a multi-chip package including a plurality of memory chips. The plurality of memory chips may be divided into a plurality of groups, which are configured to communicate with the controller 1100 over corresponding first to kth channels (CH1 to CHk). In addition, memory chips included in one group may be configured to communicate with the controller 1100 over a common channel. In a variation thereof, the memory system 1000' may be modified such that one memory chip is connected to one channel.

As described above, the memory system 1000' in accordance with an embodiment of the present disclosure may include the memory device 1200' having an improved degree of integration and improved characteristics, and thus the degree of integration and characteristics of the memory system 1000' can be improved. The memory device 1200' may be configured as a multi-chip package for increasing the data storage capacity and the operation speed of the memory system 1000'.

Figure 5:
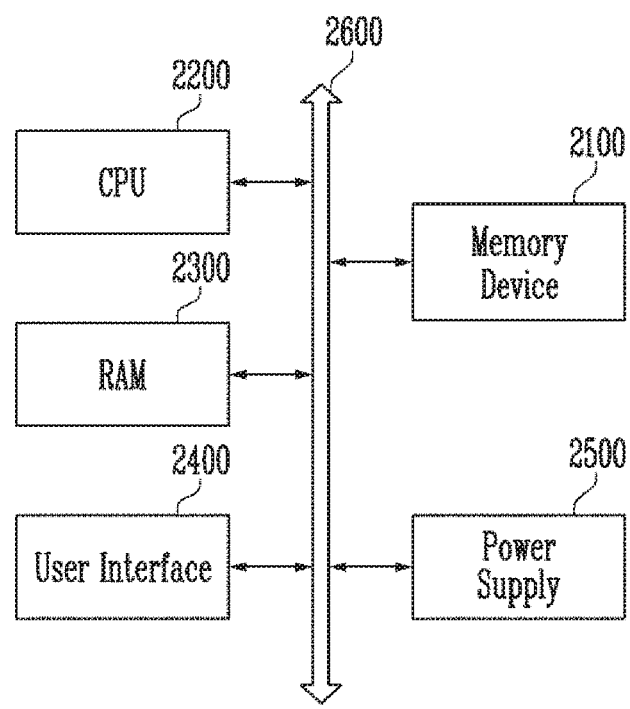
FIGS. 5 and 6 are block diagrams illustrating configurations of computing systems in accordance with embodiments of the present disclosure.

FIG. 5 is a block diagram illustrating an exemplary configuration of a computing system in accordance with an embodiment of the present disclosure. Hereinafter, description of contents overlapping with those described above will be omitted.

Referring to FIG. 5, the computing system 2000 in accordance with an embodiment of the present disclosure may include a memory device 2100, a CPU 2200, a RAM 2300, a user interface 2400, a power supply 2500, a system bus 2600, and the like.

The memory device 2100 may store data provided through the user interface 2400, data processed by the CPU 2200, and the like. In addition, the memory device 2100 may be electrically connected to the CPU 2200, the RAM 2300, the user interface 2400, the power supply 2500, and the like through the system bus 2600. For example, the memory device 2100 may be connected to the system bus 2600 through a controller (not shown) or directly. When the memory device 2100 is directly connected to the system bus 2600, a function of the controller may be performed by the CPU 2200, the RAM 2300, etc.

The memory device 2100 may be a nonvolatile memory. Also, the memory device 2100 may include a structure described with reference to FIGS. 1A to 2G. The memory device may be manufactured according to a manufacturing method described with reference to FIGS. 1A to 2G. In an embodiment, the memory device 2100 may include: a stack structure including conductive layers and insulating layers, which are alternately stacked; an opening including a first opening penetrating the stack structure and second openings protruding from the first opening; and a channel layer including channel regions located in the second openings and impurity regions located in the first opening, the impurity regions having an impurity concentration higher than that of the channel regions. The structure and manufacturing method of the memory device 2100 are the same as described above, and therefore, their detailed descriptions will not be repeated herein.

The memory device 2100 may be a multi-chip package including a plurality of memory chips as described with reference to FIG. 4.

The computing system 2000 configured as described above may be a computer, an ultra mobile PC (UMPC), a workstation, a netbook, a personal digital assistant (PDA), a portable computer, a web tablet, a wireless phone, a mobile phone, a smartphone, an e-book, a portable multimedia player (PMP), a portable game console, a navigation device, a black box, a digital camera, a 3-dimensional television, a digital audio recorder, a digital audio player, a digital picture recorder, a digital picture player, a digital video recorder, a digital video player, a device for communicating information in a wireless environment, one of a variety of electronic devices constituting a home network, one of a variety of electronic devices constituting a computer network, one of a variety of electronic devices constituting a telematics network, an RFID device, etc.

As described above, the computing system 2000 in accordance with an embodiment of the present disclosure may include the memory device 2100 having an improved degree of integration and improved characteristics, and thus the degree of integration and characteristics of the computing system 2000 can be improved.

Figure 6:
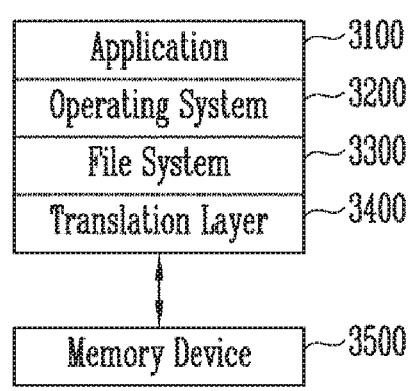

FIG. 6 is a block diagram illustrating a computing system in accordance with an embodiment of the present disclosure.

Referring to FIG. 6, the computing system 3000 in accordance with an embodiment of the present disclosure may include a software layer including an operating system 3200, an application 3100, a file system 3300, a translation layer 3400, and the like. In addition, the computing system 3000 includes a hardware layer of a memory device 3500, etc.

The operating system 3200 may manage software resources, hardware resources, etc. of the computing system 3000, and control program execution of a central processing unit. The application 3100 may be one of a variety of application programs running on the computing system 3000, and may be a utility executed by the operating system 3200.

The file system 3300 means a logical structure for managing data, files, etc. in the computing system 3000, and organizes the data or files stored in the memory device 3500 according to a rule. The file system 3300 may be determined depending on the operating system 3200 used in the computing system 3000. For example, when the operating system 3200 is one of Windows operating systems of Microsoft, the file system 3300 may be a file allocation table (FAT) or a NT file system (NTFS). When the operating system 3200 is one of Unix/Linux operating systems, the file system 3300 may be an extended file system (EXT), a Unix file system (UFS), or a journaling file system (JFS).

In this drawing, the operating system 3200, the application 3100, and the file system 3300 are shown as individual blocks. However, the application 3100 and the file system 3300 may be included in the operating system 3200.

The translation layer 3400 translates an address into a form suitable for the memory device 3500 in response to a request from the file system 3300. For example, the translation layer 3400 translates a logical address generated by the file system 3300 into a physical address of the memory device 3500. Mapping information between the logical address and the physical address may be stored as an address translation table. For example, the translation layer 3400 may be a flash translation layer (FTL), a universal flash storage link layer (ULL), etc.

The memory device 3500 may be a nonvolatile memory. Also, the memory device 3500 may include a structure described with reference to FIGS. 1A to 2G. The memory device may be manufactured according to a manufacturing method described with reference to FIGS. 1A to 2G. In an embodiment, the memory device 3500 may include: a stack structure including conductive layers and insulating layers, which are alternately stacked; an opening including a first opening penetrating the stack structure and second openings protruding from the first opening; and a channel layer including channel regions located in the second openings and impurity regions located in the first opening, the impurity regions having an impurity concentration higher than that of the channel regions. The structure and manufacturing method of the memory device 3500 are the same as described above, and therefore, their detailed descriptions will not be repeated herein.

The computing system 3000 configured as described above may be divided into an operating system layer performed in an upper level region and a controller layer performed in a lower level region. The application 3100, the operating system 3200, and the file system 3300 are included in the operating system layer, and may be driven by a working memory of the computing system 3000. In addition, the translation layer 3400 may be included in the operating system layer or the controller layer.

According to the present disclosure, a semiconductor device is provided having a stable structure and improved reliability. Also, an improved manufacturing method is provided for making the semiconductor device that is easier to implement, and reduces the overall manufacturing cost.

Example embodiments have been disclosed herein, and although specific terms are employed, they are used and are to be interpreted in a generic and descriptive sense only and not for unduly limiting the scope of the disclosed invention. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present disclosure as set forth in the following claims.

What is claimed is:

1. A semiconductor device comprising:
   a stack structure including conductive layers and insulating layers, which are alternately stacked;
   an opening including a first opening penetrating the stack structure and second openings protruding from the first opening; and
   a channel layer including channel regions located in the second openings and impurity regions located in the first opening, the impurity regions having an impurity concentration higher than that of the channel regions.

2. The semiconductor device of claim 1, wherein the channel regions are located at levels corresponding to the conductive layers, and the impurity regions are located at levels corresponding to the insulating layers.

3. The semiconductor device of claim 1, wherein the channel regions and the impurity regions are alternately arranged.

4. The semiconductor device of claim 1, wherein the impurity regions have conductivity.

5. The semiconductor device of claim 1, further comprising:
   barrier patterns formed in the channel regions; and
   a gap fill layer formed in the channel layer.

6. The semiconductor device of claim 5, wherein an interface between the barrier patterns and the gap fill layer is located on the same plane as that between the channel regions and the impurity regions.

7. The semiconductor device of claim 5, wherein an interface between the barrier patterns and the gap fill layer is located closer to the first opening than that between the channel regions and the impurity regions.

8. The semiconductor device of claim 5, wherein the barrier patterns include a material having a higher etch selectivity different from the channel layer.

9. The semiconductor device of claim 5, wherein the barrier patterns include oxide, nitride or metal.

10. The semiconductor device of claim 1, wherein the impurity regions have a thickness that is less than that of the channel regions.

11. The semiconductor device of claim 1, wherein the impurity regions have surfaces rougher than those of the channel regions.

12. A semiconductor device comprising:
a stack structure including conductive layers and insulating layers, which are alternately stacked;
an opening including a first opening penetrating the stack structure and second openings protruding from the first opening; and
a channel layer including first regions located in the second openings and second regions located in the first opening, wherein the second regions have a greater electrical conductivity than that of the first regions.

13. The semiconductor device of claim 12, wherein the first regions are located at levels corresponding to the conductive layers, and the second regions are located at levels corresponding to the insulating layers.

14. The semiconductor device of claim 12, further comprising barrier patterns formed in the first regions.

15. The semiconductor device of claim 14, wherein the barrier patterns include a material having a higher etch selectivity different from the channel layer.

16. The semiconductor device of claim 14, wherein the barrier patterns include oxide, nitride or metal.

17. A semiconductor device comprising:
a stack structure;
a gap fill layer including a penetration part penetrating the stack structure and protrusion parts protruding from a sidewall of the penetration part; and
a channel layer including channel regions respectively surrounding the protrusion parts and impurity regions surrounding the penetration part, the impurity regions having an impurity concentration higher than that of the channel regions.

18. The semiconductor device of claim 17, wherein the stack structure includes conductive layers and insulating layers, which are alternately stacked, and the protrusion parts are located at levels corresponding to the conductive layers.

19. The semiconductor device of claim 17, further comprising barrier patterns interposed between the channel regions and the protrusion parts.

20. The semiconductor device of claim 19, wherein the barrier patterns include oxide, nitride or metal.

* * * * *